(12) United States Patent
Yun et al.

(10) Patent No.: US 9,413,367 B2
(45) Date of Patent: Aug. 9, 2016

(54) METHOD AND APPARATUS FOR CALIBRATING OUTPUT FREQUENCY OF OSCILLATOR

(71) Applicant: Samsung Electronics Co., Ltd., Suwon-si (KR)

(72) Inventors: Seok Ju Yun, Hwaseong-si (KR); Seong Joong Kim, Hwaseong-si (KR); Jae Sup Lee, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 14/475,077

(22) Filed: Sep. 2, 2014

(65) Prior Publication Data
US 2015/0288368 A1 Oct. 8, 2015

(30) Foreign Application Priority Data
Apr. 7, 2014 (KR) ........................ 10-2014-0041208

(51) Int. Cl.
*H03L 7/099* (2006.01)
*H03L 7/08* (2006.01)
*H03L 7/083* (2006.01)

(52) U.S. Cl.
CPC .............. *H03L 7/099* (2013.01); *H03L 7/0802* (2013.01); *H03L 7/083* (2013.01)

(58) Field of Classification Search
CPC .............................. H03L 7/0802; H03L 7/099
USPC ............................................. 331/18, 14, 44
See application file for complete search history.

(56) References Cited

U.S. PATENT DOCUMENTS

| 7,274,229 | B1 | 9/2007 | Humphreys et al. |
| 7,274,232 | B2 * | 9/2007 | Lin ........................ H03L 7/0896 327/149 |
| 7,358,823 | B2 * | 4/2008 | Abadeer ................. H03L 7/095 331/177 V |
| 2003/0206042 | A1 | 11/2003 | Walker et al. |
| 2007/0254613 | A1 * | 11/2007 | Cranford, Jr. ............. H03L 7/18 455/260 |
| 2010/0033257 | A1 * | 2/2010 | Pellerano ................. H03L 7/099 331/1 A |
| 2012/0313714 | A1 | 12/2012 | Kargar et al. |
| 2013/0120034 | A1 | 5/2013 | Kimura et al. |

FOREIGN PATENT DOCUMENTS

| JP | 2006-180349 A | 7/2006 |
| KR | 10-0793988 B1 | 1/2008 |
| KR | 10-2011-0073177 A | 6/2011 |

OTHER PUBLICATIONS

Pletcher, Nathan M., et al. "A 2GHz 52 µW Wake-Up Receiver with-72dBm Sensitivity Using Uncertain-IF Architecture." Solid-State Circuits Conference, 2008. ISSCC 2008. 29.2. IEEE International. IEEE, 2008. (3 pages).

Drago, Salvatore, et al. "A 200 µA duty-cycled PLL for wireless sensor nodes in 65 nm CMOS." Solid-State Circuits, IEEE Journal of 45.7 (2010): 1305-1315.

* cited by examiner

*Primary Examiner* — Joseph Chang
(74) *Attorney, Agent, or Firm* — NSIP Law

(57) ABSTRACT

Provided is a method and an apparatus to calibrate an output of an oscillator. The method includes calibrating the output frequency of the oscillator to be a predetermined frequency. The method also generates a differential signal corresponding to the calibrated frequency, and operates the oscillator in response to the differential signal. The oscillator is controlled by the differential signal to remove common mode noise.

27 Claims, 20 Drawing Sheets

METHOD AND APPARATUS FOR CALIBRATING OUTPUT FREQUENCY OF OSCILLATOR

CROSS-REFERENCE TO RELATED APPLICATION(S)

This application claims the benefit under 35 USC 119(a) of Korean Patent Application No. 10-2014-0041208, filed on Apr. 7, 2014, in the Korean Intellectual Property Office, the entire disclosure of which is incorporated herein by reference for all purposes.

BACKGROUND

1. Field

The following description relates to a method and apparatus to calibrate an output frequency of an oscillator.

2. Description of Related Art

An ultra low power wireless transmission and reception device is used in a low power communication field, for example, a wireless sensor node communication system, a telemetry communication system, and other similar systems, in which a battery faces restrictions in terms of a size and an exchange. In the low power communication field, a frequency synthesizer, for example, a phase-locked loop (PLL) and a voltage-controlled oscillator (VCO) consume most power.

To reduce power consumption in the low power wireless communication field, a structural element that would normally require a large amount of power may need to be reconfigured so that it uses a reduced amount of power. Also, to implement the ultra low power wireless transmission and reception device, power consumption in the frequency synthesizer is reduced.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In accordance with an illustrative example, there is provided an output frequency calibration method, including calibrating an output frequency of an oscillator to be a predetermined frequency; generating a differential signal corresponding to the calibrated frequency; and operating the oscillator in response to the differential signal.

The calibrating may include coarse-tuning the output frequency using a first control signal, and fine-tuning the coarse-tuned output frequency using a second control signal.

The generating may include generating the first control signal to be a first differential signal corresponding to the output frequency, wherein the coarse-tuning may include coarse-tuning the output frequency using the first differential signal.

The generating may include generating the second control signal corresponding to the fine-tuned output frequency to be a second differential signal, wherein the operating may include controlling the output frequency using the second differential signal.

The fine-tuning may include locking the coarse-tuned output frequency to be the predetermined frequency through a phase-locked loop (PLL), and maintaining the second control signal to correspond to the locked frequency.

The maintaining may include converting the second control signal to a digital code in response to a lock detection signal being output by locking the output frequency in the PLL, and storing, in a storing unit, the digital code corresponding to the second control signal.

The method may also include turning off the PLL in response to the digital code being stored in the storing unit.

The method may further include converting the digital code stored in the storing unit into a second differential signal; and controlling the output frequency based on the second differential signal.

The oscillator may include a pair of varactors, each having a different polarity, and the pair of varactors being configured to receive the differential signal as an input.

The coarse-tuning may include coarse-tuning the output frequency to be a predetermined frequency through a binary search based on a result of comparing the predetermined frequency and the output frequency.

The coarse-tuning may include comparing the output frequency of the oscillator with a reference frequency to retrieve a frequency closest to a predetermined frequency, generating a first control signal to operate the oscillator at the retrieved frequency, and locking the output frequency at the retrieved frequency.

The method may also include controlling the output frequency of the oscillator by controlling a capacitor value of a capacitor bank in the oscillator.

The fine-tuning may include generating the second control signal to be a second differential signal, which may include a first control voltage and a second control voltage, and controlling the oscillator to oscillate at an output frequency corresponding to a differential component voltage corresponding to a difference between the first control voltage and the second control voltage.

In accordance with an illustrative example, there is provided a computer program embodied on a non-transitory computer readable medium configured to control a processor to perform the method described above.

In accordance with another illustrative example, there is provided an output frequency calibration apparatus, including a calibrator configured to calibrate an output frequency of an oscillator to be a predetermined frequency and generate a differential signal corresponding to the calibrated frequency, wherein the oscillator is configured to operate at the predetermined frequency in response to the differential signal.

The calibrator may include a coarse-tuner configured to coarse-tune the output frequency using a first control signal; and a fine-tuner configured to fine-tune the coarse-tuned output frequency using a second control signal.

The coarse-tuner may be configured to generate the first control signal to be a first differential signal corresponding to the output frequency, and control the output frequency using the first differential signal.

The fine-tuner may be configured to generate the second control signal corresponding to the fine-tuned output frequency to be a second differential signal, and control the output frequency using the second differential signal.

The calibrator further may include a phase-locked loop (PLL) configured to lock the coarse-tuned output frequency to be the predetermined frequency, and wherein the fine-tuner may include a storing unit configured to store the second control signal corresponding to the locked frequency.

The fine-tuner may also include a control signal converter configured to convert the second control signal to a digital code in response to a lock detection signal being output by locking the output frequency in the PLL, and wherein the storing unit may be configured to store the digital code corresponding to the second control signal.

The PLL may be turned off in response to the digital code being stored in the storing unit.

The control signal converter may be configured to convert the digital code stored in the storing unit into a second differential signal, and wherein the fine-tuner may be configured to control the output frequency using the second differential signal.

The oscillator may include a pair of varactors, each having a different polarity.

The coarse-tuner may be configured to coarse-tune the output frequency to be a predetermined frequency through a binary search based on a result of comparing the predetermined frequency and the output frequency.

The coarse-turner may be further configured to compare the output frequency of the oscillator with a reference frequency to retrieve a frequency closest to a predetermined frequency, generate a first control signal to operate the oscillator at the retrieved frequency, and lock the output frequency at the retrieved frequency.

The coarse-turner may be further configured to control the output frequency of the oscillator by controlling a capacitor value of a capacitor bank in the oscillator.

The fine-tuner may be further configured to generate the second control signal to be a second differential signal, which may include a first control voltage and a second control voltage, and control the oscillator to oscillate at an output frequency corresponding to a differential component voltage corresponding to a difference between the first control voltage and the second control voltage.

Other features and aspects will be apparent from the following detailed description, the drawings, and the claims.

BRIEF DESCRIPTION OF THE DRAWINGS

These and/or other aspects will become apparent and more readily appreciated from the following description of the embodiments, taken in conjunction with the accompanying drawings in which.

Figure 1:
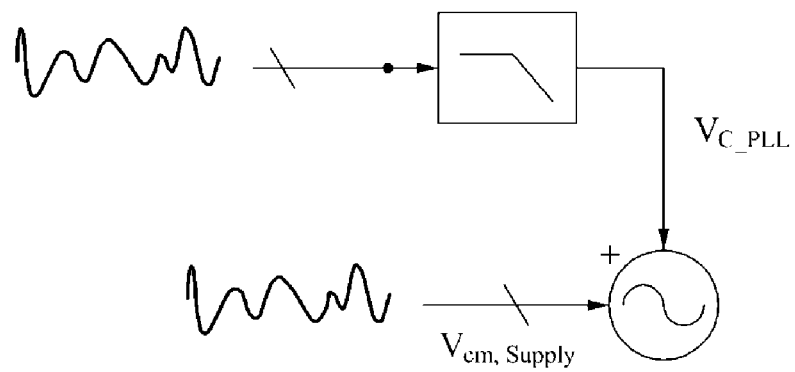
FIG. 1 illustrates a configuration of an oscillator according to a related art.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. Also, descriptions of functions and constructions that are well known to one of ordinary skill in the art may be omitted for increased clarity and conciseness.

Throughout the drawings and the detailed description, the same reference numerals refer to the same elements. The drawings may not be to scale, and the relative size, proportions, and depiction of elements in the drawings may be exaggerated for clarity, illustration, and convenience.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

In an embodiment, accuracy may be improved in an output frequency from a voltage-controlled oscillator (VCO) during a low power operation without using a phase-locked loop (PLL).

In another embodiment, to improve accuracy of an output frequency, a VCO calibrates the output frequency and removes common mode noise based on a differential signal. Hereinafter, the VCO is referred to as an oscillator. Circuit compensation is performed on the output frequency to improve accuracy of the output frequency in the oscillator without operating a PLL. Also, circuit complexity is reduced to realize low power consumption.

In still another embodiment, a calibration circuit, for example, a coarse-tuner and a PLL, are used to find a desired frequency at an initial stage, and a low power circuit, for example, a fine-tuner, is used to improve accuracy of an output frequency after calibration. Through an implementation of the calibration circuit and the low power circuit, power consumption is reduced and accuracy of the output frequency increases in an oscillator.

Figure 2:
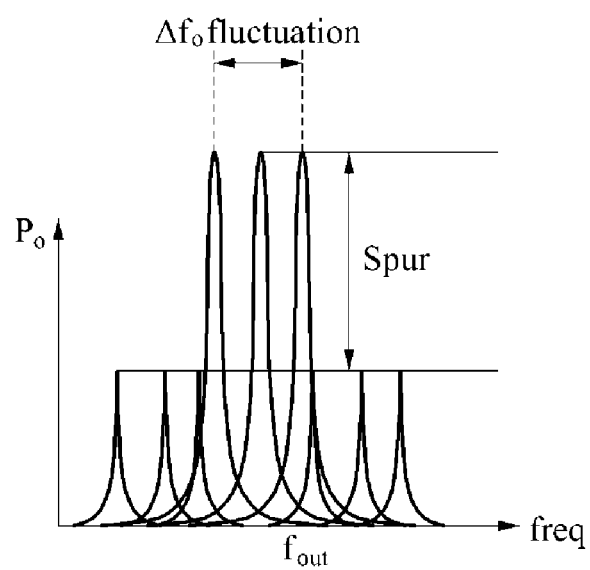
FIG. 2 illustrates frequency fluctuation occurring in the oscillator according to the related art.

FIG. 1 illustrates an oscillator according to a related art. FIG. 2 illustrates frequency fluctuation occurring in the oscillator according to the related art.

Referring to FIG. 1, noise occurring in a power source and noise occurring in a substrate may distort an output frequency of an oscillator and deteriorate accuracy of the output frequency. The noise occurring in the power source is, for example, included in $V_{CM\_Supply}$, and the noise occurring in the substrate is, for example, included in $V_{C\_PLL}$. In this example, a spectrum of the output frequency affected by the noise in a general oscillator is shown in FIG. 2. An oscillator integrated in a chip may not exhibit an ideal pulse, for example, in a frequency domain, due to a variety of common mode noise existing in the chip. For example, when the output frequency of the oscillator is not locked using a PLL, frequency fluctuation, for example, Δfo occurs in the output frequency.

In this example, the frequency fluctuation of the output frequency is proportional to a gain $K_{VCO}$ of the oscillator and a change in a voltage input $V_{C\_PLL}$ of the oscillator as shown in Equations 1 and 2.

$$\Delta fo = K vco * \Delta V_{C\_PLL} \quad \text{[Equation 1]}$$

$$\Delta fo = K_{CM} * \Delta V_{CM\_Supply} \quad \text{[Equation 2]}$$

In Equation 1, $\Delta V_{CM\_PLL}$ denotes a voltage change value input from the PLL, and $\Delta V_{CM\_Supply}$ denotes a voltage change value input from the power source of the oscillator. $K_{VCO}$ denotes a gain of the oscillator, and $K_{CM}$ denotes susceptibility to power source common mode noise in the output frequency of the oscillator. For example, $Kvco = \partial fo/\partial V_C$ and $K_{CM} = \partial fo/\partial V_{CM}$.

As shown in Equations 1 and 2, values of $K_{VCO}$ and $K_{CM}$ and a susceptibility to external noise needs to be minimized to design an oscillator unsusceptible to the external noise. In accordance with an illustrative configuration, a method of calibrating an output frequency of an oscillator controls the oscillator based on a differential signal and minimizes the values of $K_{VCO}$ and $K_{CM}$ to reduce the susceptibility of the oscillator to the external noise.

Hereinafter, descriptions about examples of various embodiments will be provided with reference to accompanying drawings.

Figure 3:
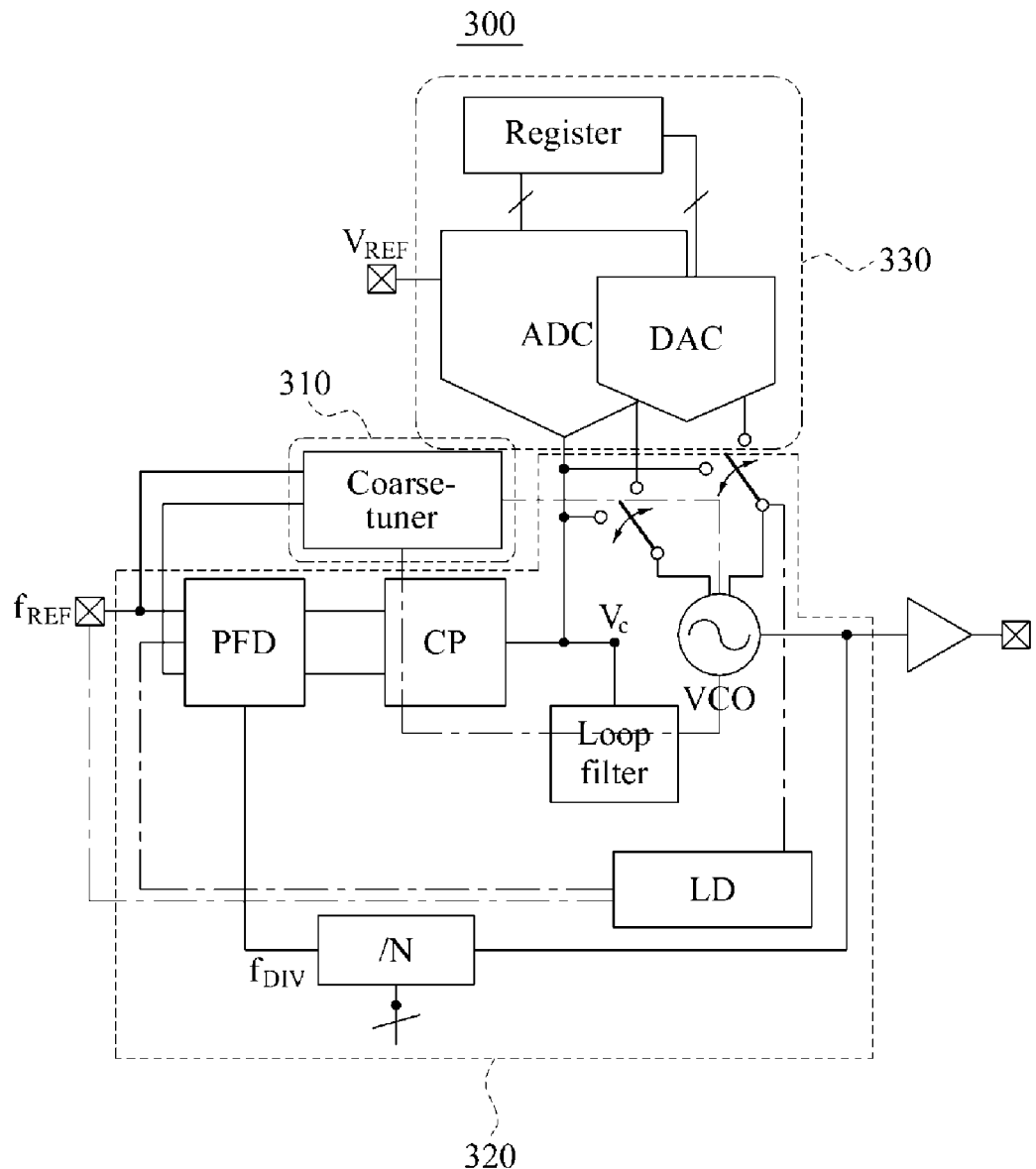
FIG. 3 illustrates an example of a configuration of an apparatus for calibrating an output frequency of an oscillator, in accordance with an embodiment.

FIG. 3 illustrates a configuration of an apparatus 300 to calibrate an output frequency of an oscillator. Hereinafter, the apparatus 300 to calibrate output frequency may also be referred to as an output frequency calibration apparatus 300.

The output frequency calibration apparatus 300 includes an oscillator, for example, a VCO, a PLL 320, a coarse-tuner 310, and a fine-tuner 330.

In this example, the PLL 320 includes a charge pump (CP), a phase frequency detector (PFD), and a loop filter.

In one configuration, the oscillator initiates oscillation when power is supplied. The coarse-tuner 310 coarsely retrieves a desired frequency band, for example, a predetermined frequency. The coarsely finding may correspond to a first calibration. Subsequently, the PLL 320 operates to finely retrieve a desired frequency. When the output frequency of the oscillator is locked by the PLL 320, for example, when a lock detection signal is detected, the fine-tuner 330 maintains in a storage unit a second control signal corresponding to the output frequency locked. The maintaining of the second control signal corresponds to a second calibration. In this example, the fine-tuner 330 may initiate the second calibration when a lock detector (LD) detects the lock detection signal.

In an example, frequency fluctuation caused by power source noise and common mode noise is minimized in the output frequency of the oscillator.

In an example, the oscillator stably outputs the output frequency while minimizing an operation of the PLL 320. For example, when the output frequency is locked, the output frequency is maintained using the fine-tuner 330 and the PLL 320 is turned off.

After frequency calibration, for example, including coarse-tuning and fine-tuning, a circuit configuration unsusceptible to power source noise and common mode noise is applied to the output frequency calibration apparatus 300.

In an example, when the operation of the PLL 320 is minimized, a stable output frequency exists at the oscillator, thereby reducing overall power consumption of a circuit.

The output frequency calibration apparatus 300 locks a coarse-tuned output frequency using the PLL 320, and detects the locked output frequency using an analog-to-digital converter (ADC) included in the fine-tuner 330. Also, the output frequency calibration apparatus 300 increases accuracy of the output frequency based on a common mode noise removal configuration, for example, a structure to generate a differential signal.

Operations of the coarse-tuner 310, the PLL 320, and the fine-tuner 330 will be explained in the following descriptions.

Hereinafter, a first control signal refers to a signal to control an oscillator in a process of coarse-tuning an output frequency, and a second control signal is a signal to control the oscillator in a process of fine-tuning the coarse-tuned output frequency. A first differential signal is a differential form of the first control signal, and the second differential signal is a differential form of the second control signal. For example, the differential form includes a positive signal and a negative signal of a control signal. In an example, the output frequency of the oscillator is controlled based on a differential component which is a difference value between the positive signal and the negative signal.

Figure 4:
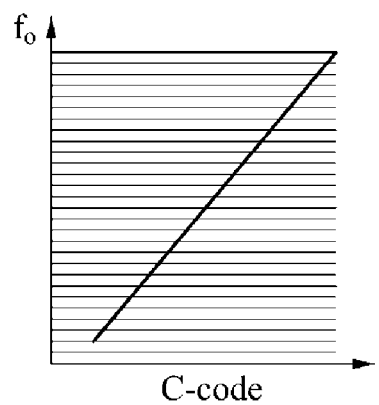
FIG. 4 illustrates an example of a frequency corresponding to a first control signal used to coarse-tune an output frequency, in accordance with an embodiment.

FIG. 4 illustrates an example of a frequency corresponding to the first control signal used to coarse-tune the output frequency, in accordance with an embodiment.

The first signal is a signal used by a coarse-tuner to control the output frequency of an oscillator. For example, the output frequency is determined based on a capacitor size of a capacitor bank. In this example, the coarse-tuner adjusts the capacitor size of the capacitor bank based on a capacitor code (C-code). The C-code activates at least one capacitor in the capacitor bank. For example, the first control signal includes the C-code, and an output frequency corresponding to the C-code is illustrated by a graph of FIG. 4.

Figure 5:
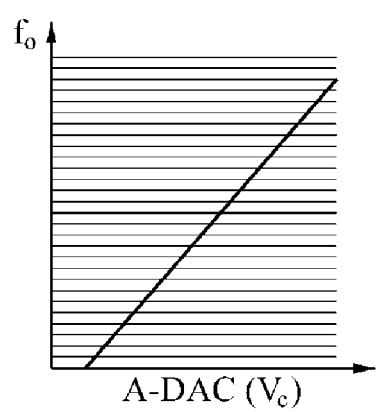
FIG. 5 illustrates an example of a frequency corresponding to a second control signal used to fine-tune an output frequency, in accordance with an embodiment.

FIG. 5 illustrates an example of a frequency corresponding to the second control signal used to fine-tune the output frequency, in accordance with an embodiment.

The second control signal refers to a signal used by a fine-tuner to control the output frequency of an oscillator. For example, the output frequency is determined based on an intensity of a control voltage, for example, $V_C$. In this example, the intensity of control voltage is expressed using a digital code. For example, the second control signal includes the intensity of the control voltage and a digital code corresponding to the intensity of the control voltage, and the output frequency corresponding to the intensity of the control voltage may be indicated by a graph of FIG. 5.

Figure 6:
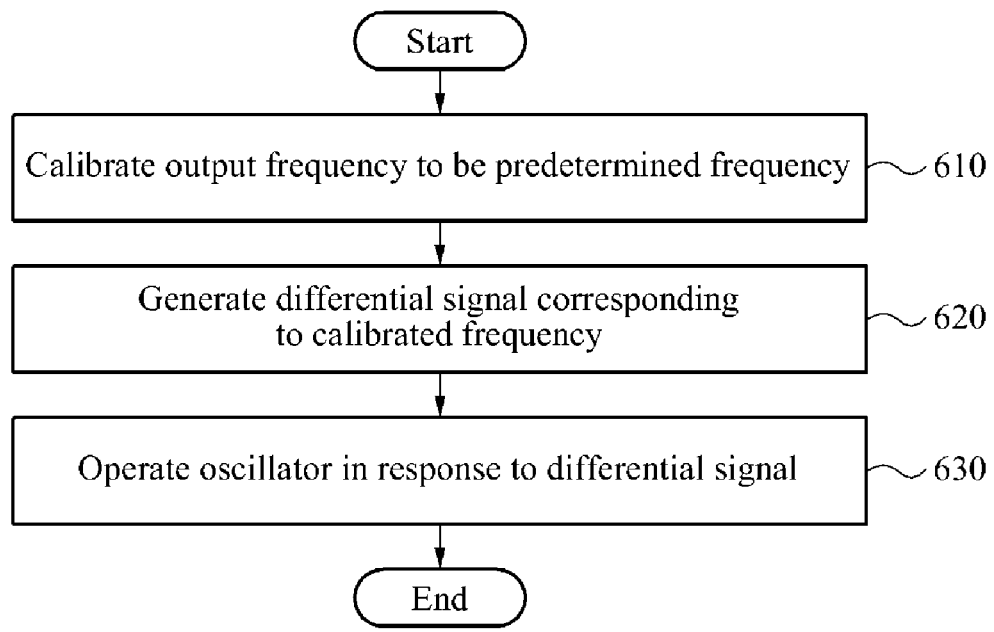
FIGS. 6 and 7 illustrate examples of an output frequency calibration method, in accordance with an embodiment.
Figure 7:
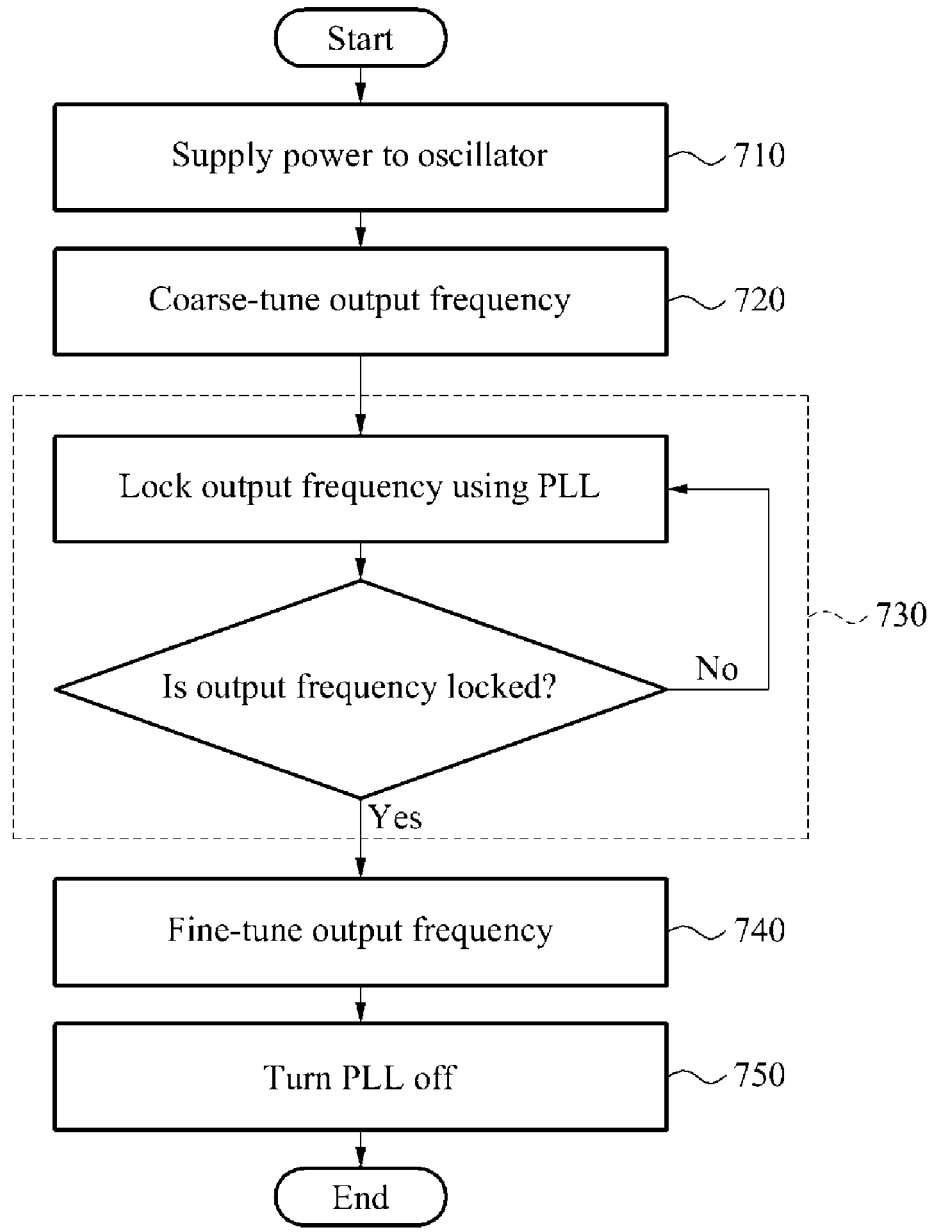

FIGS. 6 and 7 illustrate examples of an output frequency calibration method, in accordance with an embodiment.

FIG. 6 is a flowchart illustrating an example of the output frequency calibration method.

In operation 610, the method calibrates an output frequency to be a predetermined frequency. In this example, the method, through a coarse-tuner, coarse-tunes the output frequency based on a first control signal. The method then fine-tunes, through a fine-tuner, the coarse-tuned output frequency based on a second control signal. The output frequency calibration method will be further described with reference to FIG. 7.

In operation 620, the method generates a differential signal corresponding to the calibrated frequency.

In an example, the method generates, through the coarse-tuner, the first control signal to be a first differential signal corresponding to the output frequency, and coarse-tunes the output frequency controlled by the first differential signal. Descriptions about a process in which the coarse-tuner generates the first differential signal and coarse-tune the output frequency will be provided with reference to FIGS. 19 and 20.

In another example, the method generates, through the fine-tuner, the second control signal corresponding to a locked output frequency to be a second differential signal, and controls the output frequency based on the second differential signal. Descriptions about a process in which the fine-tuner generates the second differential signal and control the output frequency of the oscillator will be provided with reference to FIGS. 8 through 18.

In operation 630, the method operates the oscillator in response to the differential signal. The differential signal includes the first differential signal and the second differential signal.

As an example, when the coarse-tuner generates the first differential signal, the method fine-tunes, through the fine-tuner, the output frequency corresponding to the first differential signal and controls the output frequency of the oscillator.

As another example, when the fine-tuner generates the second differential signal, the method controls the output frequency of the oscillator based on the second differential signal.

FIG. 7 is a flowchart illustrating an example of an output frequency calibration method, in accordance with an embodiment.

In operation 710, the method supplies power to an oscillator. When the power is supplied, the oscillator initiates oscillation.

In operation 720, the method coarse-tunes, through the coarse-tuner, an output frequency is coarse-tuned. In this example, the method determines a frequency closest to a desired frequency by comparing the output frequency of the oscillator with a reference frequency $f_{ref}$. For example, through the coarse-tuner, the method retrieves a frequency closest to the desired frequency through a binary search. The binary search outputs a result as the retrieve frequency indicative of a comparison between the desired frequency and the output frequency. The method generates a first control signal such that the oscillator operates at the retrieved frequency. In another example, the coarse-tuner generates the first control signal to be a first differential signal.

In operation 730, the method locks the output frequency using a PLL. For example, the method operates the PLL until the output frequency is locked to be the retrieved frequency. In this example, the output frequency locked by the PLL may correspond to the desired frequency.

In operation 740, the method fine tunes the output frequency through the fine-tuner. For example, using a storing unit, the method maintains the output frequency locked at the PLL. In this example, through a control signal converter, the method converts the second control signal, for example, a control voltage $V_C$, corresponding to the locked output frequency into a form of a digital code. The method stores in the storing unit the second control signal provided in the form of the digital code. Using the fine-tuner, the method controls the output frequency of the oscillator based on the second control signal stored in the storing unit. In an example, the second control signal is generated to be the second differential signal.

In an example, the method converting the second control signal, at the control signal converter, into the form of the digital code is stored in the storing unit. The control signal converter may include, for example, an ADC. When a lock detection signal is output, the method directs the control signal converter to convert the digital code into an analog form to perform an output. For example, a voltage corresponding to the control voltage $V_C$ detected from an input of the ADC may be generated to be a digital-to-analog converter (DAC) output.

Thus, the output frequency locked at the desired frequency is maintained after the PLL is turned off. Due to a configuration divided into a coarse-tuning and a fine-tuning, the output frequency, similar to an output frequency obtained when the PLL is operating is obtained despite the PLL being turned off. Thus, calibration resolution with respect to the output frequency of the oscillator improves.

In operation 750, the method turns off the PLL. Due to high power consumption of the PLL, power saving may be required to realize an ultra low power communication.

In one illustrative example, the output frequency calibration method is configured to perform operations 720 through 740 through various structural elements illustrated and described with respect to FIGS. 10 through 13. For example, the coarse-tuner 310 of FIG. 3 corresponds to a coarse-tuner 1010 of FIG. 10. The PLL 320 of FIG. 3 corresponds to a PLL 1120 of FIG. 11, and the fine-tuner 330 corresponds to each of a fine-tuner 1230 of FIG. 12 and a fine-tuner 1330 of FIG. 13.

Figure 8:
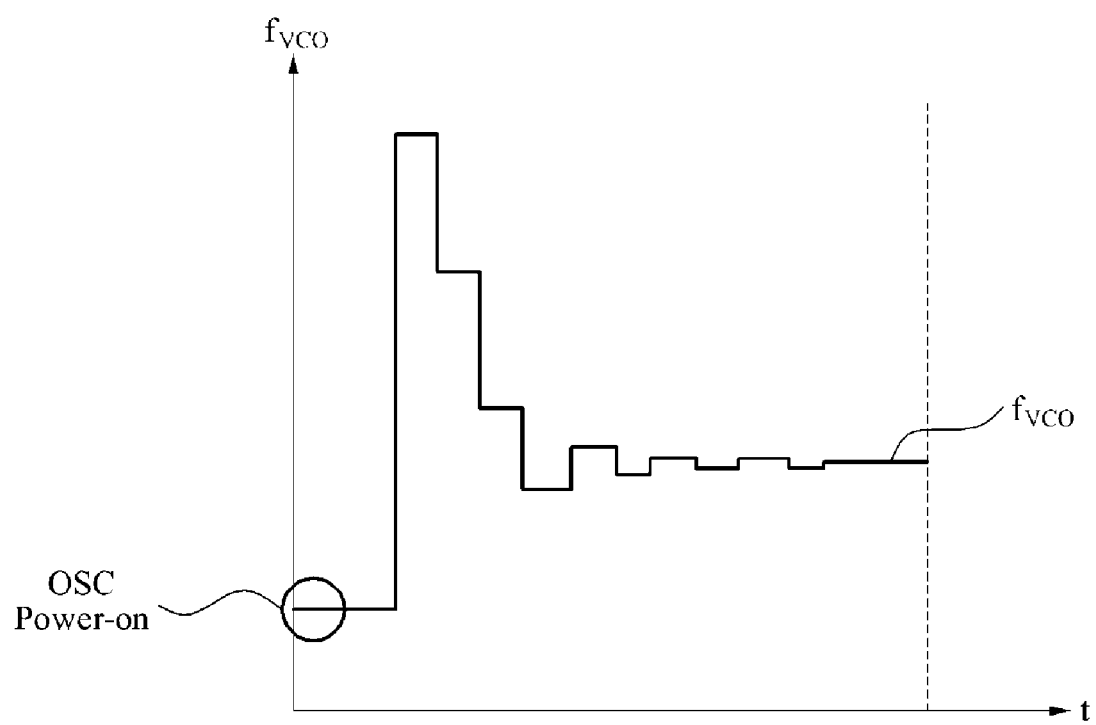
FIG. 8 illustrates an example of coarse-tuning an output frequency controlled by a first control signal, in accordance with an embodiment.

FIG. 8 illustrates an example of coarse-tuning an output frequency controlled by the first control signal, in accordance with an embodiment.

Referring to FIG. 8, the output frequency, for example, $f_{vco}$, of an oscillator may be coarse-tuned to be at a desired or at a predetermined frequency through a binary search after power is supplied to the oscillator. In this example, the output frequency may be controlled by the first control signal.

Figure 9:
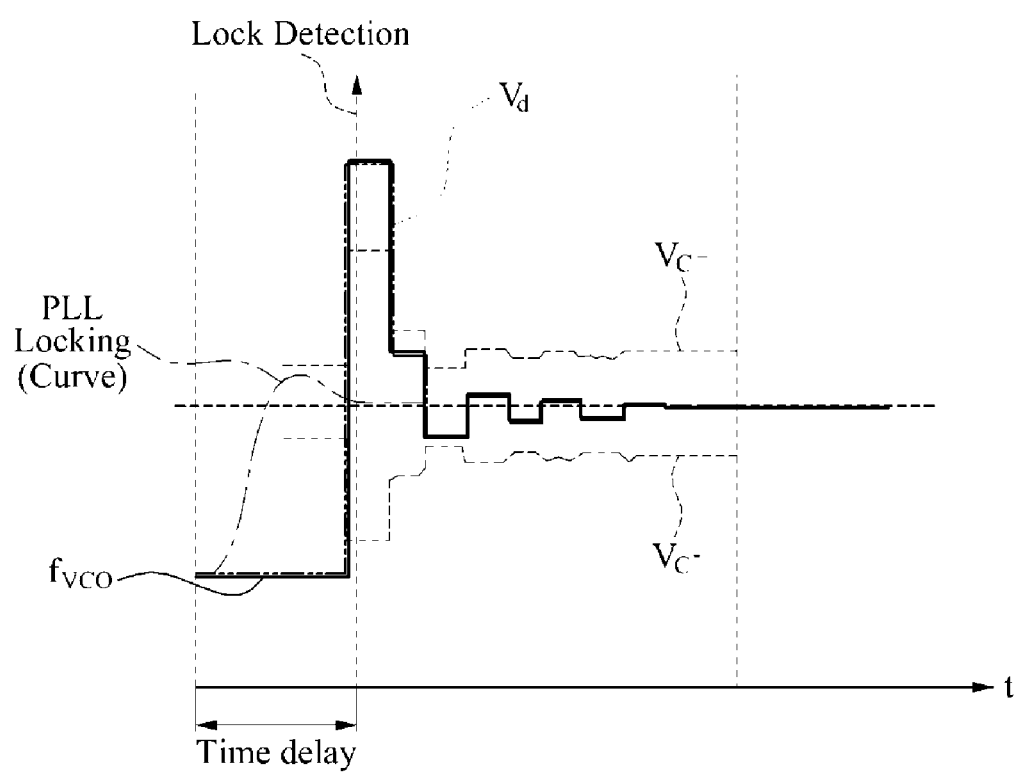
FIG. 9 illustrates an example of fine-tuning an output frequency controlled by a second control signal, in accordance with an embodiment.

FIG. 9 illustrates an example of fine-tuning an output frequency controlled by a second control signal, in accordance with an embodiment.

Referring to FIG. 9, the second control signal is generated to be a second differential signal. The second differential signal includes a first control voltage, for example, $V_C^+$, and a second control voltage, for example, $V_C^-$. The oscillator oscillates at an output frequency corresponding to a differential component voltage, for example, $V_d$, corresponding to a difference value between the first control voltage and the second control voltage. In this example, the differential component voltage corresponding to the second differential signal is free of common mode noise existing in the first control voltage and the second control voltage. As a result, the common mode noise is removed from the output frequency of the oscillator operating based on the second differential signal.

In an example, a time delay occurs until a lock detection signal is detected. When the lock detection signal is detected, the fine-tuner fine-tunes the output frequency controlled by the second differential signal as illustrated in FIG. 9. For example, the fine-tuner fine-tunes the output frequency controlled by the second differential signal such that the output frequency, for example, $f_{vco}$, is a predetermined frequency.

Figure 10:
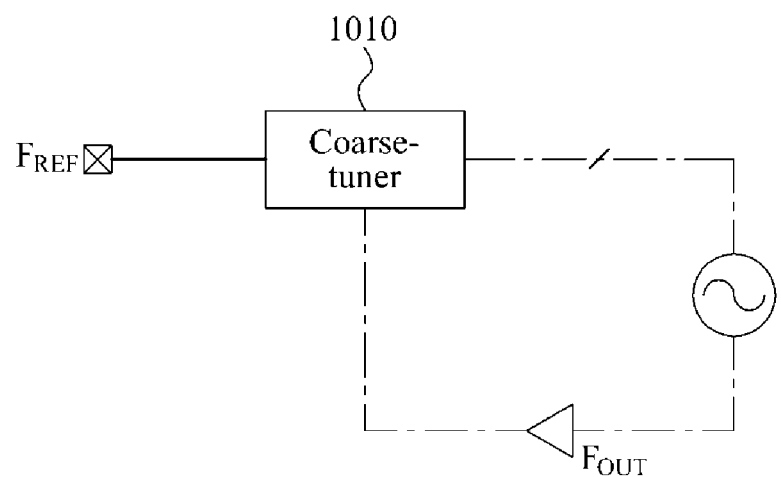
FIG. 10 illustrates an example of a coarse-tuner, in accordance with an embodiment.

FIG. 10 illustrates the coarse-tuner 1010, in accordance with an embodiment.

Referring to FIG. 10, as described above, the output frequency calibration apparatus controls the coarse-tuner 1010 to coarse-tune an output frequency to be a predetermined frequency by comparing a reference frequency, for example, $F_{REF}$, and the output frequency, for example, $F_{OUT}$, of an oscillator.

Figure 11:
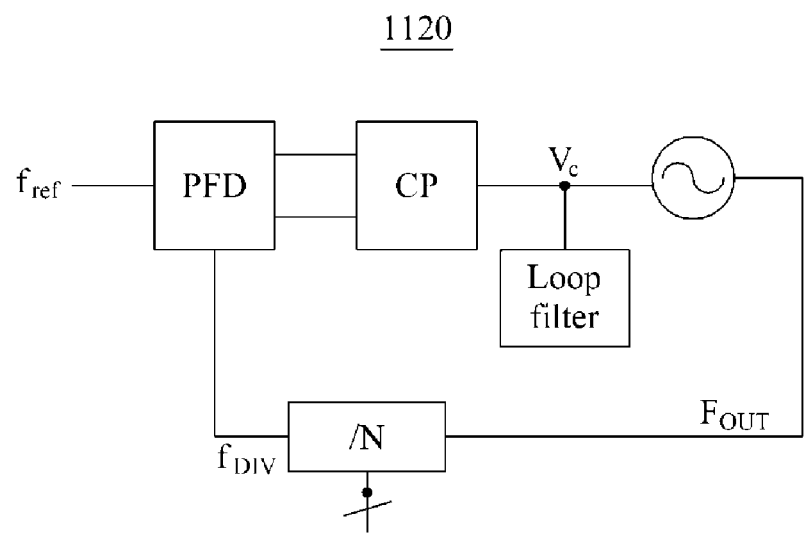
FIG. 11 illustrates an example of a phase-locked loop (PLL), in accordance with an embodiment.

FIG. 11 illustrates the PLL 1120, in accordance with an embodiment.

Referring to FIG. 11, as described above, the output frequency calibration apparatus controls the PLL 1120, which includes a CP, a PFD, a loop filter, and a divider, for example, /N. In this example, the PLL 1120 locks an output frequency, for example, $F_{OUT}$, of an oscillator to be a predetermined frequency.

Figure 12:
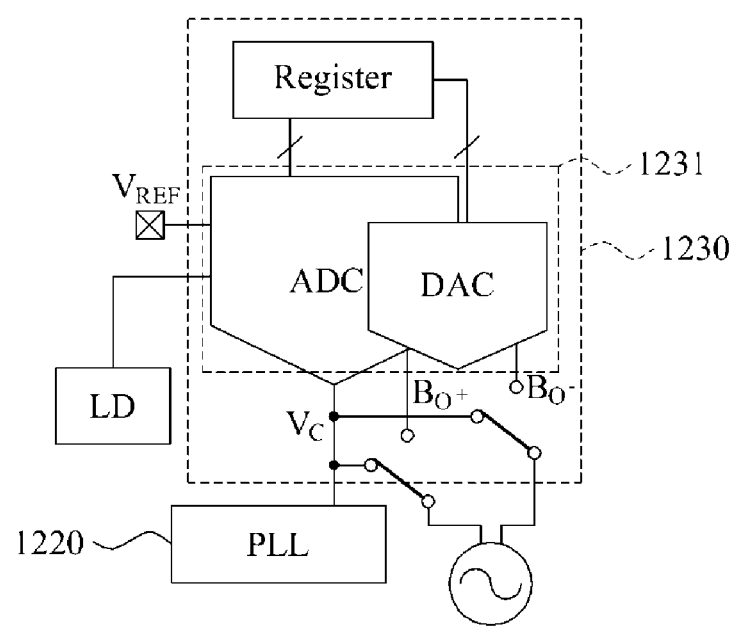
FIG. 12 illustrates an example of a fine-tuner, in accordance with an embodiment.

FIG. 12 illustrates the fine-tuner 1230, in accordance with an embodiment.

Referring to FIG. 12, as described above, an output frequency calibration apparatus controls the fine-tuner 1230 to store a second control signal corresponding to an output frequency locked by a PLL 1220 in a storing unit, for example, a register, using a control signal converter 1231. In an example, the control signal converter 1231 includes an ADC.

When a lock detection signal is detected at an LD, the fine-tuner 1230 stores in the storing unit, the second control signal corresponding to the locked output frequency based on a form of a digital code.

Figure 13:
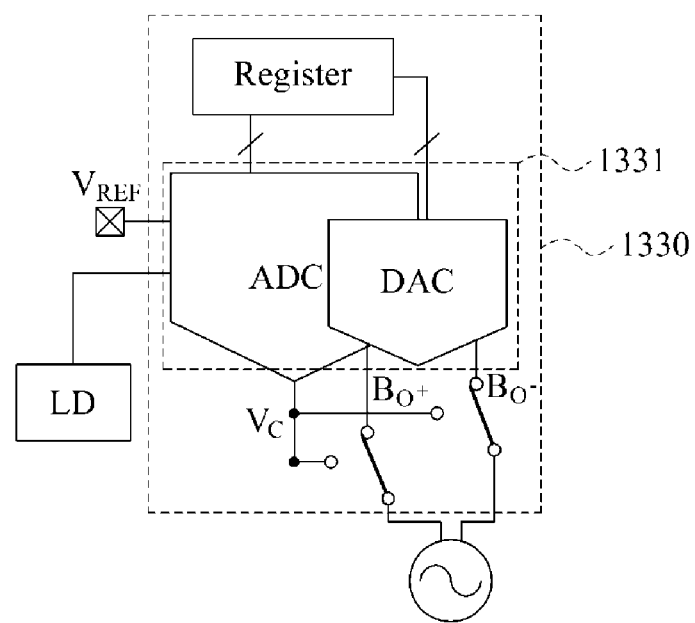
FIG. 13 illustrates an example of a control signal converter, in accordance with an embodiment.

FIG. 13 illustrates a control signal converter 1331, in accordance with an embodiment.

Referring to FIG. 13, an output frequency calibration apparatus controls the control signal converter 1331. For example, when the second control signal is stored in the storing unit of FIG. 12, a PLL is turned off. The fine-tuner 1330 includes the control signal converter 1331.

In an example, when the PLL is turned off, the control signal converter 1331 converts the second control signal of the form of the digital code into an analog form and transmits the converted second control signal to an oscillator. The control signal converter 1331 includes a DAC. Also, the control signal converter 1331 generates the second control signal to be a second differential signal.

Figure 14:
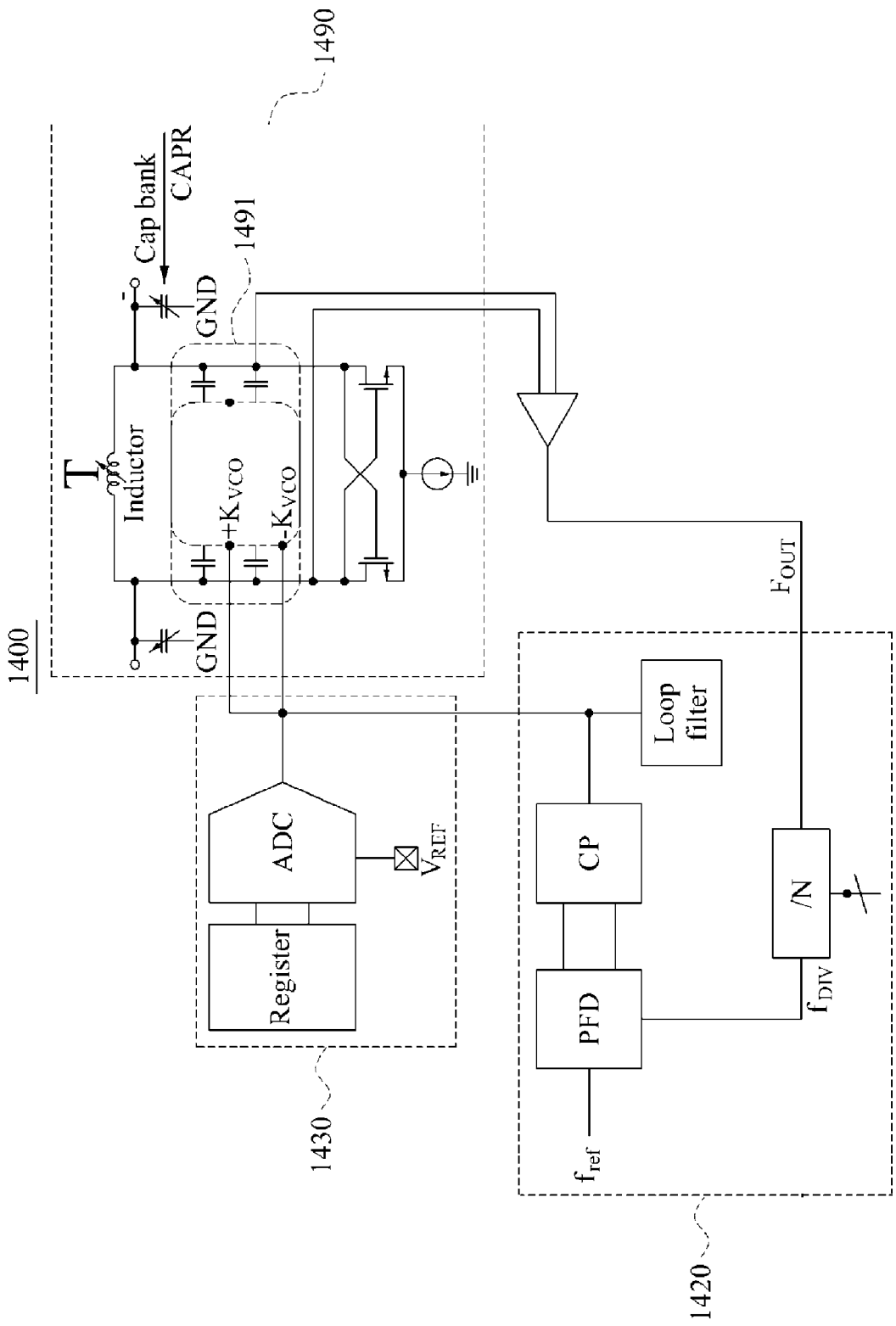
FIG. 14 illustrates an example of configurations of a PLL, a fine-tuner, and an oscillator, in accordance with an embodiment.

FIG. 14 illustrates configurations of a PLL 1420, a fine-tuner 1430, and an oscillator 1490, in accordance with an embodiment.

FIG. 14 illustrates the configuration of FIG. 12 in further detail. An output frequency calibration apparatus 1400 includes the PLL 1420, the fine-tuner 1430, and the oscillator 1490. The PLL 1420 and the fine-tuner 1430 of FIG. 14 may structurally correspond to the PLL 1220 and the fine-tuner 1230 of FIG. 12, respectively.

In FIG. 14, when the PLL 1420 locks an output frequency of the oscillator 1490, a gain of the oscillator 1490 is expressed by a varactor pair 1491 as shown in Equation 3. In one example, the varactor pair 1491 is a pair of varactors, each having a different polarity.

$$f_{osc}=fo+2K_{VCO} \cdot V_C \cdot v_n \qquad \text{[Equation 3]}$$

In Equation 3, $f_o$ denotes the output frequency of the oscillator 1490 when $V_C$ is "0", $K_{VCO}$ denotes the gain of the oscillator 1490 derived by the varactor pair 1491, a control voltage $V_C$ denotes an input voltage of the oscillator 1490, and $v_n$ denotes a common mode noise voltage entering through the input voltage. For example, as described in FIG. 14, the control voltage $V_C$ may be converted into a digital code by the ADC included in the fine-tuner 1430 and stored in a register. In this example, each varactor of the varactor pair 1491 has an identical ratio, for example, $\Delta C_N/\Delta V_C$, of a capacitor variation to a control voltage. For example, $K_{VCO1} \approx K_{VCO2}$.

Figure 15:
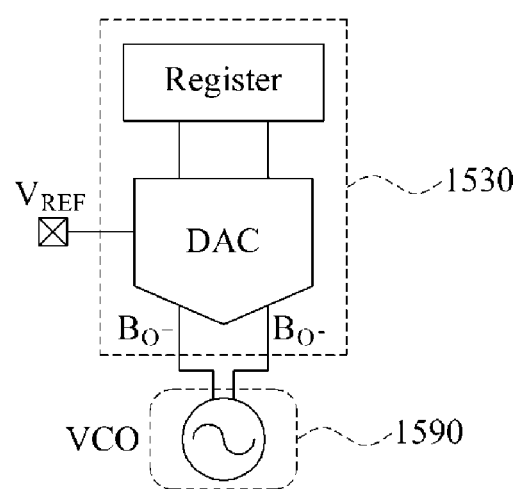
FIGS. 15 and 16 illustrate examples of configurations of a fine-tuner and an oscillator, in accordance with an embodiment.
Figure 16:
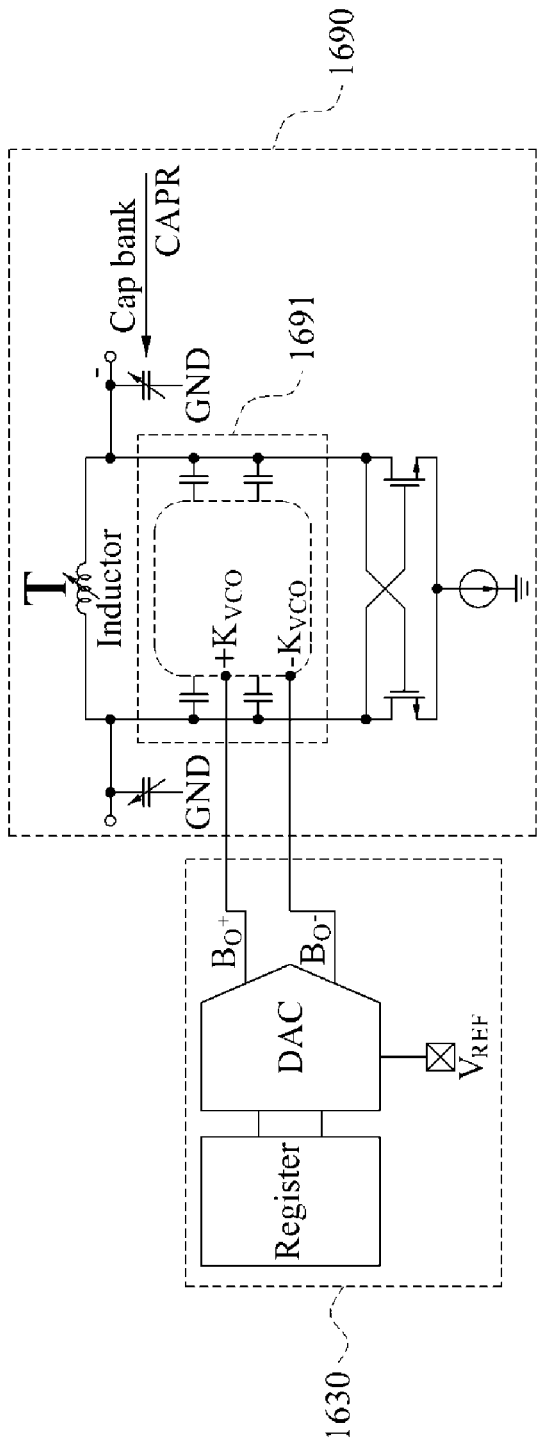

FIG. 15 illustrates a fine-tuner 1530 and an oscillator 1590, and FIG. 16 illustrates a fine-tuner 1630 and an oscillator 1690, in accordance with an embodiment.

Referring to FIG. 15, when an operation period of an ADC is terminated, the fine-tuner 1530 uses a DAC output voltage, in place of a digital code stored through the ADC. The DAC output voltage is obtained by generating a second control signal to be a second differential signal, and is converted into two differential voltages, for example, $B_{O+}$ and $B_O^-$. The two differential voltages correspond to the first control voltage and the second control voltage of FIG. 9, respectively.

Referring to FIG. 16, the differential voltages are input to a varactor pair 1691 in which each varactor has a different polarity. In this example, an output frequency of the oscillator 1690 is expressed by Equation 4.

$$f_{osc}=fo+K_{VCO} \cdot V_C \cdot (v_{n1}-v_{n2}) \qquad \text{[Equation 4]}$$

In Equation 4, $v_{n1}$ and $v_{n2}$ denote common mode noise voltages included in the differential voltages. In this example, frequency fluctuation with respect to the differential voltages is offset as shown in Equation 5.

$$\Delta f_{osc}=\text{derv}[f_{osc}(v_n)]=0 \qquad \text{[Equation 5]}$$

The output frequency calibration apparatus 1600 of the oscillator 1690 minimizes a susceptibility to a common mode noise voltage, for example, $v_n$, entering through an input voltage using the varactor pair 1691 in which each varactor has a different polarity.

Figure 17:
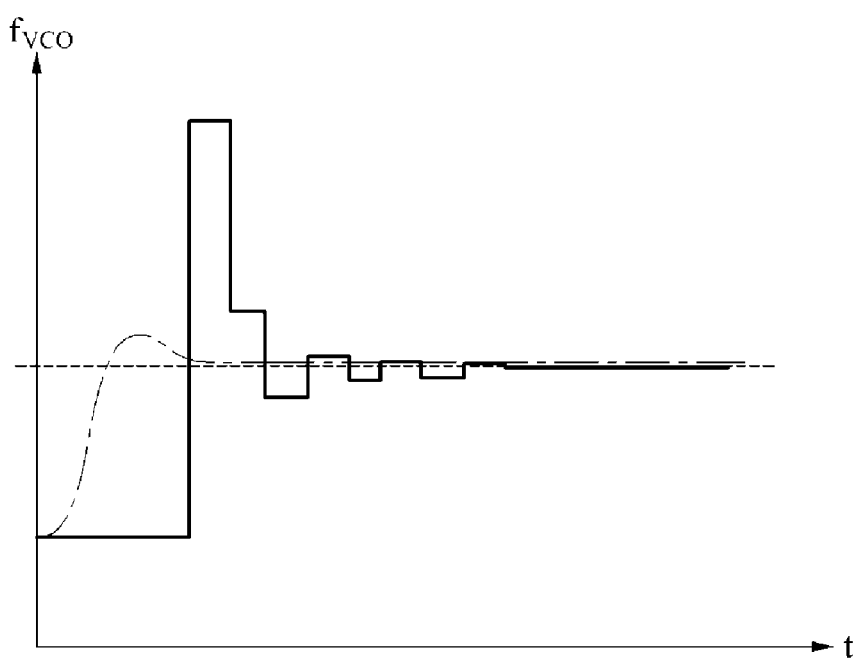
FIGS. 17 and 18 illustrate examples of an output frequency to be calibrated and a control signal corresponding to the output frequency, in accordance with an embodiment.
Figure 18:
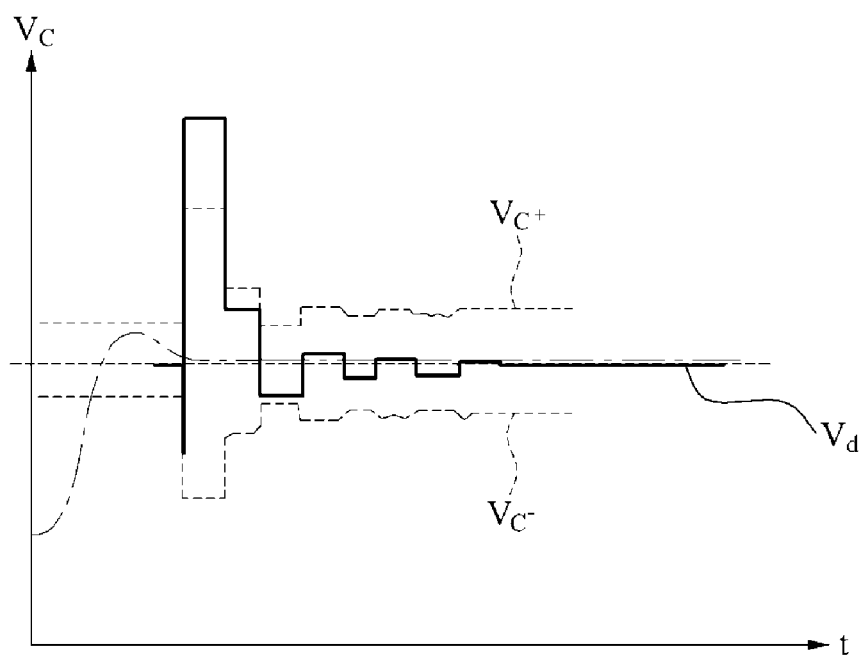

FIGS. 17 and 18 illustrate examples of an output frequency to be calibrated and a control signal corresponding to the output frequency.

An output frequency calibration apparatus differentially restores a second control signal, for example, a control voltage $V_C$. A process of fine-tuning an output frequency is illustrated in FIG. 17. A process of fine-tuning a control voltage controlling the output frequency of FIG. 17 is illustrated in FIG. 18. In FIG. 18, the control voltage corresponds to the second control signal, and is generated to be a second differential signal. The graph of FIG. 18 may be similar to the graph of FIG. 9.

In an example, an oscillator having a differential input and a DAC output including a differential output minimizes an output change, for example, frequency fluctuation, with respect to common mode noise.

Figure 19:
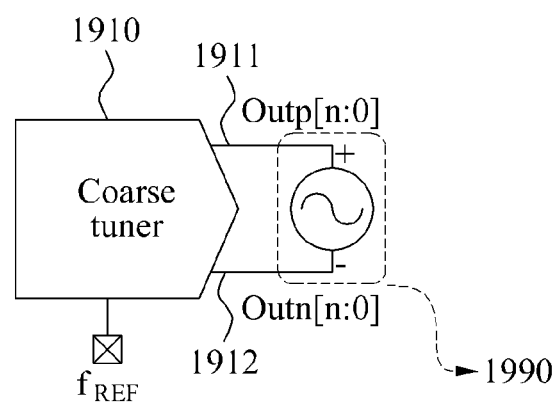
FIG. 19 illustrates an example of a coarse-tuner to generate a first differential signal, in accordance with an embodiment.

FIG. 19 illustrates a coarse-tuner 1910 to generate a first differential signal, in accordance with an embodiment.

Referring to FIG. 19, the coarse-tuner 1910 generates a first control signal to be the first differential signal corresponding to an output frequency. The first differential signal includes a first coarse-tuning signal and a second coarse-tuning signal corresponding to a C-code. For example, the C-code corresponds to a capacitor size of a capacitor bank in an oscillator 1990. Furthermore, a rate of change of the oscillator 1990 changes differentially in response to the digital code and voltage, which are inputted differentially. For example, the oscillator 1990 includes a positive $K_{VCO}$ as + input terminal, and a negative $K_{VCO}$ as − input terminal.

The first coarse-control signal corresponds to a positive coarse-tuning signal 1911, and the second coarse-tuning signal corresponds to a negative coarse-tuning signal 1912. For example, the first coarse-tuning signal and the second coarse-tuning signal each includes n bits.

In an example, the first coarse-tuning signal and the second coarse-tuning signal are input to a varactor pair in which each varactor has a different polarity. By using the first differential signal, the output frequency calibration apparatus is insusceptible to a frequency fluctuation occurring while the output frequency is being coarse-tuned by the coarse-tuner 1910. Furthermore, the output frequency calibration apparatus is also insusceptible to a frequency fluctuation occurring after coarse-tuning.

Figure 20:
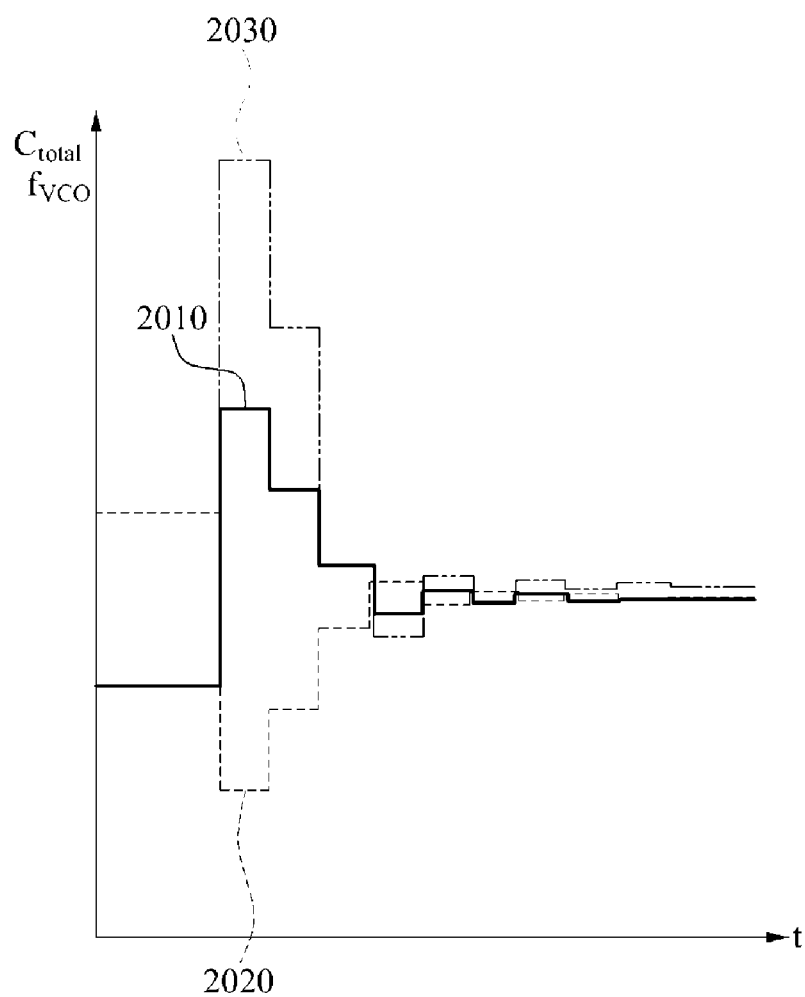
FIG. 20 illustrates an example of coarse-tuning an output frequency controlled by a first differential signal, in accordance with an embodiment.

FIG. 20 illustrates an example of coarse-tuning an output frequency controlled by a first differential signal, in accordance with an embodiment.

Referring to FIG. 20, the first differential signal may include a positive coarse-tuning signal 2010 and a negative coarse-tuning signal 2020. A total coarse-tuning signal 2030 corresponds to a differential component between the positive coarse-tuning signal 2010 and the negative coarse-tuning signal 2020. As indicated by a graph of FIG. 20, the coarse-tuner 1910 of FIG. 19 coarse-tunes the output frequency, thereby reducing frequency fluctuation.

Figure 21:
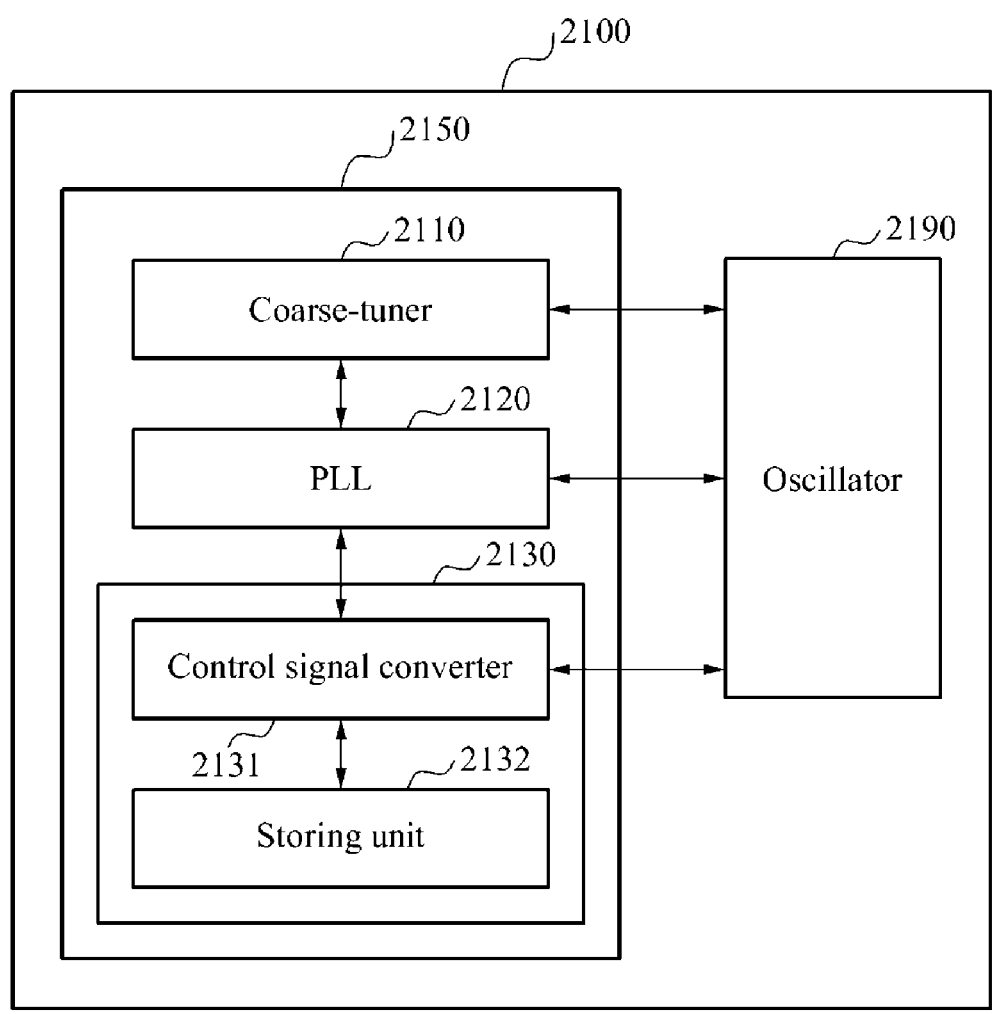
FIG. 21 illustrates an example of a configuration of an output frequency calibration apparatus, in accordance with an embodiment.

FIG. 21 illustrates an example of an output frequency calibration apparatus 2100, in accordance with an embodiment.

The output frequency calibration apparatus 2100 includes a calibrator 2150 and an oscillator 2190.

The oscillator 2190 oscillates at an output frequency. The oscillator 2190 is controlled by a voltage input, for example, a control voltage. For example, a frequency corresponding to an input of a control voltage $V_C$ is output. In this example, the oscillator 2190 operates at a predetermined output frequency in response to a differential signal.

The calibrator 2150 calibrates the output frequency of the oscillator 2190 to be a predetermined frequency, and generates a differential signal corresponding to the calibrated output frequency. The calibrator 2150 includes a coarse-tuner 2110, a PLL 2120, and a fine-tuner 2130. For example, the calibrator 2150 locks the output frequency coarse-tuned at the coarse-tuner 2110 to be the desired or the predetermined frequency using the PLL 2120, and maintains the locked output frequency using the fine-tuner 2130.

The coarse-tuner 2110 coarse-tunes an output frequency controlled by a first control signal. In an example, the coarse-tuner 2110 controls the output frequency of the oscillator 2190 based on the first control signal. For example, the coarse-tuner 2110 controls the output frequency of the oscillator 2190 by controlling a capacitor value of a capacitor bank included in the oscillator 2190. As an example, the capacitor value of the capacitor bank is adjusted based on a C-code included in the first control signal output by the coarse-tuner 2110. In this example, the coarse-tuner 2110 generates the first control signal to be a first differential signal.

The PLL 2120 locks the coarse-tuned output frequency to be the predetermined frequency. When the output frequency is locked, an LD (not shown) outputs a PLL locking detection signal.

The fine-tuner 2130 fine-tunes a coarse-tuned output frequency controlled by a second control signal. The fine-tuner 2130 includes a control signal converter 2131 and a storing unit 2132. For example, the fine-tuner 2130 maintains the output frequency to be the predetermined frequency locked at the PLL 2120 although the PLL is turned off. In this example, the fine-tuner 2130 controls the output frequency of the oscillator 2190 based on the second control signal. For example, the fine-tuner maintains the second control signal corresponding to the locked output frequency.

The control signal converter 2131 converts the second control signal converted into a digital code, into a second differential signal. As an example, when a lock detection signal is output in response to the locking of the output frequency, the control signal converter 2131 converts the second control signal into a form of a digital code.

For example, the storing unit 2132 stores the second control signal converted into the form of the digital code in a register. Because the second control signal corresponding to the locked output frequency is stored in the register of the storing unit 2132, the output frequency calibration apparatus 2100 maintains the output frequency of the oscillator to be at the predetermined frequency in a state in which the PLL is turned off.

As a result of the configuration described above, effect of common mode noise on the output frequency of the oscillator 2190, for instance, is minimized. For example, a frequency fluctuation may be reduced in the output frequency of the oscillator 2190.

In an example, because the effect of the common mode noise is reduced, the oscillator 2190 has a stable output frequency against a variety of external noise.

In accordance with the various illustrative configuration described above, a change in an output frequency caused by power source noise and common mode noise is minimized in the oscillator 2190 having a differential input and the control signal converter 2131 having a differential output. In this example, the differential input is an input of the second differential signal, the differential output is an output of the second differential signal, and the control signal converter 2131 is included in the fine-tuner 2130.

The units described herein may be implemented using hardware components. For example, the hardware components may include memories, controllers, processors or processing devices, microphones, amplifiers, band-pass filters, and audio to digital convertors. A processing device may be implemented using one or more general-purpose or special purpose computers, such as, for example, a processor, a controller and an arithmetic logic unit, a digital signal processor, a microcomputer, a field programmable array, a programmable logic unit, a microprocessor or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a processing device may include multiple processors or a processor and a controller. In addition, different processing configurations are possible, such a parallel processors.

As a non-exhaustive illustration only, a terminal or device described herein may refer to mobile devices such as a cellular phone, a personal digital assistant (PDA), a digital camera, a portable game console, and an MP3 player, a portable/personal multimedia player (PMP), a handheld e-book, a portable laptop PC, a global positioning system (GPS) navigation, a tablet, a sensor, and devices such as a desktop PC, a high definition television (HDTV), an optical disc player, a setup box, a home appliance, and the like that are capable of wireless communication or network communication consistent with that which is disclosed herein.

It is to be understood that in the embodiment of the present invention, the operations in FIGS. 6 and 7 are performed in the sequence and manner as shown although the order of some operations and the like may be changed without departing from the spirit and scope of the described configurations.

In accordance with an illustrative example, a computer program embodied on a non-transitory computer-readable medium may also be provided, encoding instructions to perform at least the methods described in FIGS. 6 and 7.

Program instructions to perform a method described in FIGS. 6 and 7, or one or more operations thereof, may be recorded, stored, or fixed in one or more computer-readable storage media. The program instructions may be implemented by a computer. For example, the computer may cause a processor to execute the program instructions. The media may include, alone or in combination with the program instructions, data files, data structures, and the like. Examples of computer-readable media include magnetic media, such as hard disks, floppy disks, and magnetic tape; optical media such as CD ROM disks and DVDs; magneto-optical media, such as optical disks; and hardware devices that are specially configured to store and perform program instructions, such as read-only memory (ROM), random access memory (RAM), flash memory, and the like. Examples of program instructions include machine code, such as produced by a compiler, and files containing higher level code that may be executed by the computer using an interpreter. The program instructions, that is, software, may be distributed over network coupled computer systems so that the software is stored and executed in a distributed fashion. For example, the software and data may be stored by one or more computer readable recording mediums. Also, functional programs, codes, and code segments for accomplishing the example embodiments disclosed herein may be easily construed by programmers skilled in the art to which the embodiments pertain based on and using the flow diagrams and block diagrams of the figures and their corresponding descriptions as provided herein.

A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. An output frequency calibration method, comprising:
   calibrating an output frequency of an oscillator to be a predetermined frequency,
   wherein the calibrating comprises:
   coarse-tuning the output frequency of the oscillator by comparing the output frequency with a reference frequency and retrieving a frequency closest to a desired frequency to operate the oscillator; and
   fine-tuning a coarse-tuned output frequency from the oscillator by locking the coarse-tuned output frequency to operate the oscillator using the differential signal, wherein the differential signal is based on the coarse-tuning and the fine-tuning;
   generating a differential signal corresponding to the calibrated frequency; and
   operating the oscillator in response to the differential signal.

2. The method of claim 1, wherein the calibrating comprises
   coarse-tuning the output frequency using a first control signal, and
   fine-tuning the coarse-tuned output frequency using a second control signal.

3. The method of claim 2, wherein the generating comprises
   generating the first control signal to be a first differential signal corresponding to the output frequency,
   wherein the coarse-tuning comprises coarse-tuning the output frequency using the first differential signal.

4. The method of claim 2, wherein the generating comprises
   generating the second control signal corresponding to the fine-tuned output frequency to be a second differential signal,
   wherein the operating comprises controlling the output frequency using the second differential signal.

5. The method of claim 2, wherein the fine-tuning comprises
   locking the coarse-tuned output frequency to be the predetermined frequency through a phase-locked loop (PLL), and
   maintaining the second control signal to correspond to the locked frequency.

6. The method of claim 5, wherein the maintaining comprises
   converting the second control signal to a digital code in response to a lock detection signal being output by locking the output frequency in the PLL, and
   storing, in a storing unit, the digital code corresponding to the second control signal.

7. The method of claim 6, further comprising:
   turning off the PLL in response to the digital code being stored in the storing unit.

8. The method of claim 6, further comprising:
   converting the digital code stored in the storing unit into a second differential signal; and
   controlling the output frequency based on the second differential signal.

9. The method of claim 1, wherein the oscillator comprises a pair of varactors, each having a different polarity, and the pair of varactors being configured to receive the differential signal as an input.

10. The method of claim 2, wherein the coarse-tuning comprises coarse-tuning the output frequency to be a predetermined frequency through a binary search based on a result of comparing the predetermined frequency and the output frequency.

11. The method of claim 2, wherein the coarse-tuning comprises
    comparing the output frequency of the oscillator with a reference frequency to retrieve a frequency closest to a predetermined frequency,
    generating a first control signal to operate the oscillator at the retrieved frequency, and
    locking the output frequency at the retrieved frequency.

12. The method of claim 11, further comprising:
    controlling the output frequency of the oscillator by controlling a capacitor value of a capacitor bank in the oscillator.

13. The method of claim 2, wherein the fine-tuning comprises
    generating the second control signal to be a second differential signal, which comprises a first control voltage and a second control voltage, and
    controlling the oscillator to oscillate at an output frequency corresponding to a differential component voltage corresponding to a difference between the first control voltage and the second control voltage.

14. A computer program embodied on a non-transitory computer readable medium configured to control a processor to perform the method of claim 1.

15. An output frequency calibration apparatus, comprising:
a calibrator configured to calibrate an output frequency of an oscillator to be a predetermined frequency and generate a differential signal corresponding to the calibrated frequency,
wherein the calibrator further comprises:
a coarse-tuner configured to coarse-tune the output frequency of the oscillator by comparing the output frequency with a reference frequency and retrieving a frequency closest to a desired frequency to operate the oscillator; and
a fine-tuner configured to fine-tune a coarse-tuned output frequency from the oscillator by locking the coarse-tuned output frequency to operate the oscillator using the differential signal, wherein the differential signal is based on the coarse-tuning and the fine-tuning, wherein the oscillator is configured to operate at the predetermined frequency in response to the differential signal.

16. The apparatus of claim 15, wherein the calibrator comprises:
a coarse-tuner configured to coarse-tune the output frequency using a first control signal; and
a fine-tuner configured to fine-tune the coarse-tuned output frequency using a second control signal.

17. The apparatus of claim 16, wherein the coarse-tuner is configured to generate the first control signal to be a first differential signal corresponding to the output frequency, and control the output frequency using the first differential signal.

18. The apparatus of claim 17, wherein the fine-tuner is configured to generate the second control signal corresponding to the fine-tuned output frequency to be a second differential signal, and control the output frequency using the second differential signal.

19. The apparatus of claim 16, wherein the calibrator further comprises a phase-locked loop (PLL) configured to lock the coarse-tuned output frequency to be the predetermined frequency, and
wherein the fine-tuner comprises a storing unit configured to store the second control signal corresponding to the locked frequency.

20. The apparatus of claim 19, wherein the fine-tuner further comprises a control signal converter configured to convert the second control signal to a digital code in response to a lock detection signal being output by locking the output frequency in the PLL, and
wherein the storing unit is configured to store the digital code corresponding to the second control signal.

21. The apparatus of claim 20, wherein the PLL is turned off in response to the digital code being stored in the storing unit.

22. The apparatus of claim 20, wherein the control signal converter is configured to convert the digital code stored in the storing unit into a second differential signal, and
wherein the fine-tuner is configured to control the output frequency using the second differential signal.

23. The apparatus of claim 15, wherein the oscillator comprises a pair of varactors, each having a different polarity.

24. The apparatus of claim 16, wherein the coarse-tuner is configured to coarse-tune the output frequency to be a predetermined frequency through a binary search based on a result of comparing the predetermined frequency and the output frequency.

25. The apparatus of claim 20, wherein the coarse-turner is further configured to compare the output frequency of the oscillator with a reference frequency to retrieve a frequency closest to a predetermined frequency, generate a first control signal to operate the oscillator at the retrieved frequency, and lock the output frequency at the retrieved frequency.

26. The apparatus of claim 25, wherein the coarse-turner is further configured to control the output frequency of the oscillator by controlling a capacitor value of a capacitor bank in the oscillator.

27. The apparatus of claim 20, wherein the fine-tuner is further configured to generate the second control signal to be a second differential signal, which comprises a first control voltage and a second control voltage, and control the oscillator to oscillate at an output frequency corresponding to a differential component voltage corresponding to a difference between the first control voltage and the second control voltage.

* * * * *